April 17, 1956 A. G. LAZZERY ET AL 2,742,627

PRONG CONNECTOR FOR PRINTED CIRCUITS

Filed Sept. 21, 1951 2 Sheets-Sheet 1

INVENTORS

ANGELO G. LAZZERY

AND DONALD MACKEY

BY H. L. Newton

ATTORNEY

April 17, 1956 A. G. LAZZERY ET AL 2,742,627

PRONG CONNECTOR FOR PRINTED CIRCUITS

Filed Sept. 21, 1951 2 Sheets-Sheet 2

INVENTORS
ANGELO G. LAZZERY
AND DONALD MACKEY
BY H. O. Muston
ATTORNEY

United States Patent Office 2,742,627

Patented Apr. 17, 1956

2,742,627

PRONG CONNECTOR FOR PRINTED CIRCUITS

Angelo G. Lazzery, Oaklyn, and Donald Mackey, Haddon Heights, N. J., assignors to Radio Corporation of America, a corporation of Delaware Application September 21, 1951, Serial No. 247,606

3 Claims. (Cl. 339—193)

This invention relates generally to wiring systems for radio receivers and the like, and in particular it relates to sockets for connecting electrical components into printed circuits.

In the prior art it has been the practice to connect electrical components, such as electronic tube sockets, into various circuits by individually soldering the various circuit leads or conductors to the desired component terminals. In order to make a good connection it is necessary that the leads or conductors be securely attached to the terminals and soldered. Where space is limited it is difficult to make good connections without electrically contacting adjacent terminals or components which should be isolated, and the assembly time is thus increased to an even greater extent. Accordingly this invention is directed to means for readily connecting component terminal means into electronic circuits.

Printed circuits or metalized circuit panels have come into extensive use in the radio industry, and are desirable for economically constructing circuit connections and certain components such as inductors, for example. Conventional tube sockets or other prong connectors, however, are not well adaptable to use in printed circuits, since the circuit connections must be soldered at terminals remote from the usual printed circuit conductors. Remote connections are undesirable both because the lead inductances between the printed circuit conductors and the socket terminals may cause objectionable operation of the circuit and because the individual soldering of the terminals to the conductors increases the assembly time. Therefore in accordance with the invention, there is provided novel tube socket means for use with printed circuits which effect improved circuit efficiency and decrease assembly time.

Accordingly it is an object of the invention to provide an improved prong connector socket assembly, which is particularly adapted for use in printed electronic circuits.

It is another object of the invention to provide a prong connector assembly which is of inexpensive construction and which is adapted to connect electrical components having terminal prongs into a radio chassis or the like by means of short conductors or leads.

It is a further object of the invention to provide improved mounting means having terminal connectors for an electrical device with external terminal connections and adapted for readily soldering with desired printed circuit conductors.

A prong connector socket constructed in accordance with the invention therefore is adapted for plug-in registration, by means of terminal connector spring contact fasteners or connector jacks, with a single aperture in a radio chassis or insulating sheet having printed electronic circuit conductors coating the sheet and extending to the edge of the aperture. The terminal connectors include integral terminal portions comprising spring extensions radially disposed about the socket body and adapted for both electrically engaging the printed circuit conductors and mechanically locking the socket in the aperture.

Further features, objects and advantages will become apparent from a consideration of the following description in conjunction with the accompanying drawings, in which.

Figures 1, 2, 3:
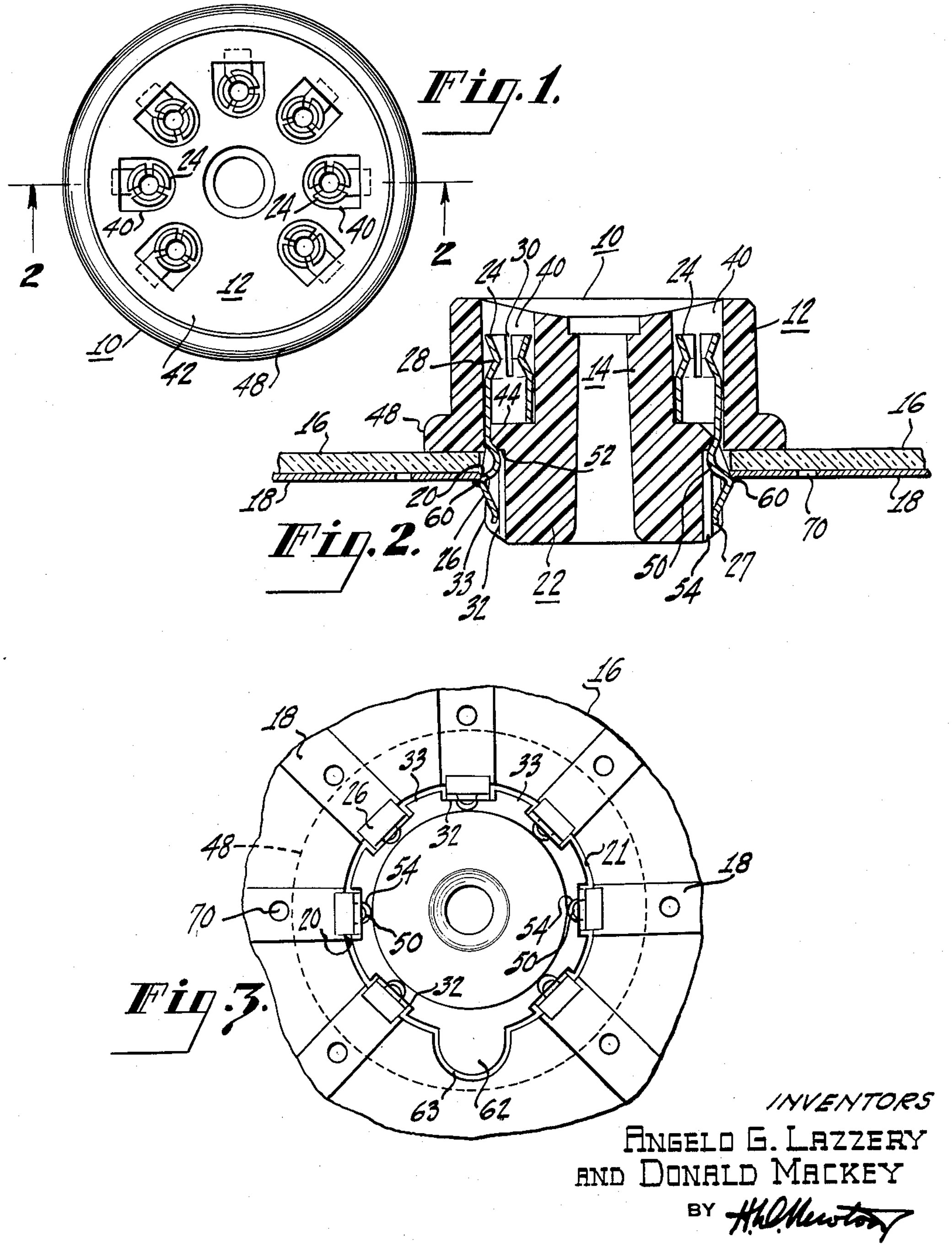
Figure 1 is a top view of a prong connector socket embodying the invention.
Figure 2 is a sectional view in elevation, of the socket of Figure 1, taken on line 2—2, showing further details of construction in accordance with the invention and a portion of a printed circuit radio chassis with which is is used.
Figure 3 is a bottom view of the socket and chassis portion of Figure 2 further showing the construction and chassis connections.

Referring to the drawing, wherein like reference characters designate similar component parts, and in particular to Figures 1 through 3, the insulated body of a tube socket or mounting device 10 for connecting miniature seven prong tubes to a printed electronic circuit is shown. The body of the socket has integrally associated cover and base portions 12 and 14 enclosing a plurality of terminal prong connectors or jacks 24. The printed circuit to which the socket terminals are to be connected comprises an insulated sheet 16 having conductors 18 coating a portion of the sheet and extending to the edge 20 of a single large aperture 21 therein. The base portion has an extension 22 with an outer periphery or diameter smaller than that of the aperture 21 for extending therethrough.

The conductive terminal prong connectors 24 have integral spring portions 26 extending from the prong connector portions and constructed in accordance with the invention to have a larger uncompressed major dimension than that of the aperture 21. The spring portions 26 are substantially V-shaped planar extensions of the otherwise conventional tubular prong connectors 24. Indentations 28 and slits 30 are provided in the conventional portion of the prong connectors 24 for firmly clamping tube terminal prongs by several spring contactor arms.

Grooves 32 are provided in accordance with the invention in the base portion extension 22 to restrict the terminals 24 in their proper circumferential position and to give additional support to the ends 27 of the spring extensions 26 which ride in the groove 32. The grooves 32 and associated ribs 33 are an important feature of the invention in that they allow compression of the springs 26, upon the insertion of the socket body extension 22 in the aperture 21, to an amount not exceeding the elastic limit of the conductive material of which they are made. Otherwise it would be necessary to center the socket upon inserting it in the aperture 21. The ribs 33 in combination with the grooves 32 upon the extension 22 however comprise an automatic centering device which protects the springs 26.

Aperture means 40 are cast or otherwise formed in the cap portion 42 of cover means 12 and are aligned for registration with miniature receiving tube terminal prongs to orient the tube and guide the prongs into contact with the terminal prong connectors 24. Thus, inside the cover portion 12 and upon the integral inner or base portion 14 is a ledge support 44 upon which the tubular prong connectors 24 rest when the spring extensions 26 ride in the grooves 32.

A mounting lip 48 is contained on the cover portion 12 of the socket assembly for engaging the insulated sheet 16 as the socket body extension 22 is forced through the aperture against the resiliency of the spring terminal extensions 26 of the connectors 24. A snap-in socket means is therefore provided by the invention, which is readily plugged into place for connection with a printed electronic circuit. Because of the V-shaped planar spring extension 26, which extends from the integrally connected base and cover portions adjacent the lip 48, the socket is retained firmly in the aperture 21 and the prong connectors 24 electrically contact the printed circuit conductors 18 at the edge 20 of the aperture 21.

An extrusion or lance 50 is provided to ride upon lip 52 of the base portion 14 thereby retaining the prong connectors 24 within apertures 40. A deeper and narrower groove 54 within the aforementioned groove 32 permits the entire spring extension 26 to be compressed, thereby forcing the lance 50 into the groove 54. The end 27 of spring 26 is broader than groove 54 and therefore rides against the back of groove 32 to apply resilient bias and force the spring connector outward to firmly engage the metallic conductor 18 at the edge of the aperture 21 in both metallic and electrical contact. Because of this engagement in metallic contact, the terminal prong connectors 24 may be easily soldered to the printed circuit conductors 18 by dip soldering. Surface tension will permit the solder to stick to the metallically engaged junction of the conductors 18 and terminals 24 to form a firmly soldered fillet joint 60. Thus the socket is well adapted for economical assembly by dip soldering methods well known in the art, without providing special clamps for holding the socket in place.

Upon the extension 22 of base portion 14 is a key 62, which mates with a corresponding keyway or alignment portion 63 in the aperture 21 to fix the socket in a single position. Accordingly the desired terminal connectors 24 may be connected with the corresponding printed circuit conductors 18. A miniature type tube may be aligned in the socket by the standard arrangement of the seven tube prongs.

Small apertures 70 are placed in the printed circuit conductors 18 for connecting external components to the socket terminals where necessary. These are placed as close as convenient to the terminal prong connectors 24 to prevent possible lead inductance from interfering with circuit operation. The small lead inductance of the improved socket because of the fillet junction 60 between the spring extension 26 and the conductors 18 gives improved circuit performance, since the circuit connections are thereby made with a low impedance point at a position very near the tube terminal prongs.

Accordingly there is provided by the invention an improved socket for mounting electrical devices into printed circuits by snap-fitting the socket by its connecting terminals into a single aperture in the printed circuit insulated carrier base to electrically engage the printed circuit connections and hold the socket firmly in place for dip soldering all of the connections simultaneously.

Figures 4, 5:
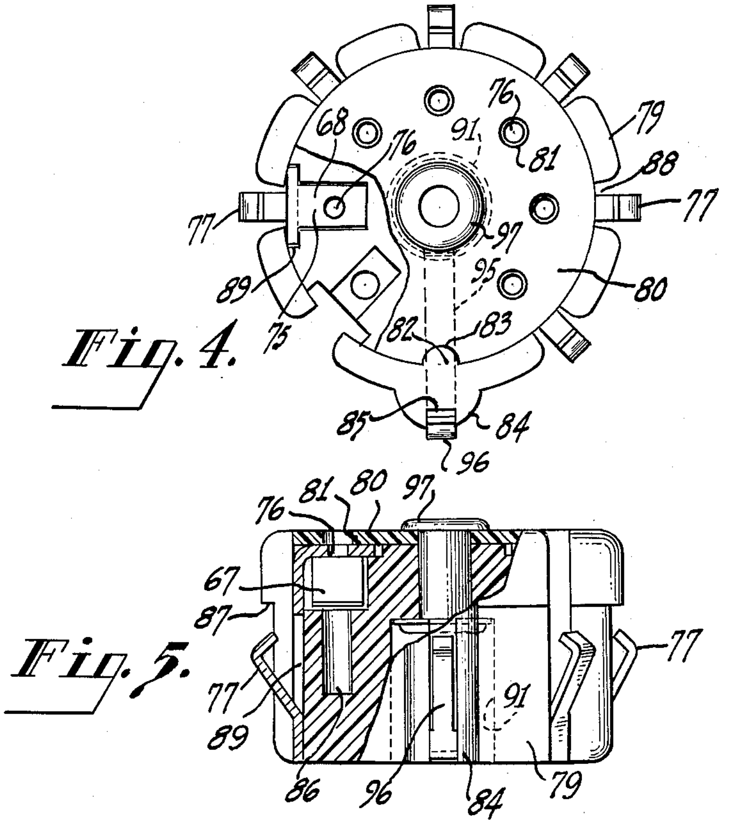
Figures 4 and 5 are respectively top and side views, partly in section, of a socket showing a further embodiment of the invention.
Figure 6:
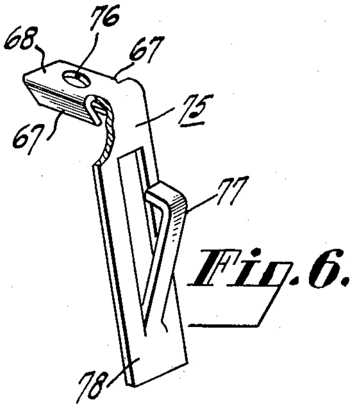
Figure 6 is a perspective view of a terminal prong connector forming part of the embodiment of Figures 4 and 5; and, Figure 7 is an elevation view of a further embodiment of a terminal prong connector or spring contact for a socket constructed in accordance with the invention.

A further embodiment of the snap fitted socket of the invention is illustrated in Figures 4 and 5. In this socket the interior terminal connectors shown in the cutaway sections and more clearly in the perspective view of Figure 6 comprise a substantially L-shaped planar member 75 having a prong receiving aperture 76 and prong engaging flanges 67 bent downward from the minor plane 68 to mechanically lock the tube prongs in place. An extending V-shaped spring portion 77 is cut out of the major plane 78 to function substantially as the spring extension 26 hereinbefore described. The tube prong engaging means forms no part of the present invention but is exemplary of a connector which may be used in accordance with the snap-in socket of the invention and may be of any desired configuration.

The base and cover portions 79 and 80 of this socket embodiment are separate members fastened together with a rivet 97 or by other suitable means. The base portion 79 has peripheral grooves 88 and therefore is shaped as a ribbed barrel member having one closed end or cover 80 containing apertures 81 aligned with the apertures 76 of the internal terminal prong connectors for receiving tube terminal prongs. The closed end 80 of the cover portion may be fitted into the base portion 79 in a fixed position by a key 83 which mates with the corresponding key in the barrel member 79. Barrel member 79 has a further key 84 for aligning the socket with a key way in the aforedescribed aperture 21 to align it with the desired printed circuit connections.

In the base portion 79 of the socket are provided tubular apertures 86 for receiving the tube terminal prongs. It is noted that these tubular apertures are closed by an insulating barrier from the bottom end of the socket to prevent solder from seeping into the prong connector cavities and thereby to permit simplified dip soldering of the connector terminals.

In assembly this socket functions in the same manner as that first described. The base portion 79 thus extends through a single aperture 21 in a suitable printed circuit, and the spring extension 77 of the terminal prong connector 75 contacts the printed circuit conductors and firmly holds the socket in place by pressing the lip 87 against the insulated printed circuit chassis. The ribs or grooves 88 in the barrel 79 permit the extremities of the spring portion 77 to extrude from the socket sufficiently to lock it in place, yet will control the spring deflection within safe limits by preventing compression of the spring to such an extent that its elastic limit is exceeded. A wider groove 89 in the inner base portion holds the major surface of the L-shaped terminal connector 75 in place and permits insertion of the connector 75 in the barrel member 79 before it is secured by the cover 80.

Should a grounding terminal be desired it is readily provided in accordance with the invention along the socket orienting key 84. Thus the strap connector 95 is positioned on the bottom of the tube socket and riveted in a well 91 in the bottom of the body of the socket by the eyelet 97 extends upward through groove 85 in key 84 in the form of a spring contact 96 which functions in the same manner as the contacts 77.

Figure 7:
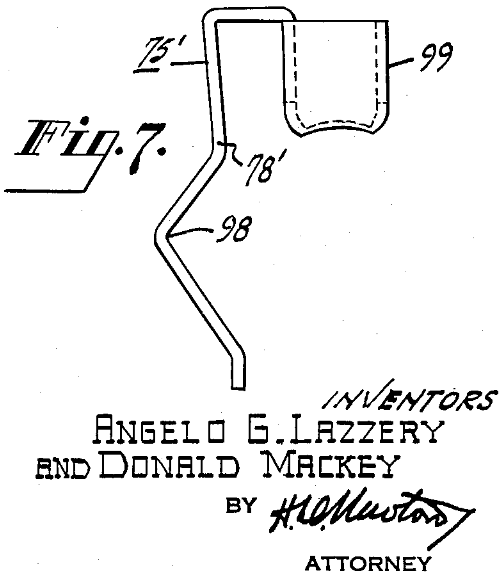

A further embodiment of the spring contact of the invention is shown in Figure 7. A continuously bent section 98 of the major portion 78′ of a terminal prong connector 75′ having suitable prong connector means 99 is provided thus affording a substantially planar V-shaped spring portion. The advantage of this particular type of terminal is increased strength and lower inductance. In installation it is necessary to provide an aperture in the barrel member 79 wide enough for the spring section 98 to protrude. It is obvious that other modifications may be made without departing from the spirit and scope of the present invention.

There is therefore provided by the invention a simplified snap-in socket assembly having those desirable features above mentioned and other apparent advantageous features. Therefore having fully described the operation and construction of the invention the features of novelty are defined in the appended claims.

What is claimed is:

1. An electrical components mounting device for connecting components having parallel conductive prongs to a metalized circuit panel, said panel comprising an insulating sheet having an aperture therein for receiving said device on the obverse side of said panel and having conductors on the reverse side of said panel for connection to said device extending to the edge of said aperture, comprising, in combination, a socket body of insulating material, a mounting lip on said body for contacting the upper surface of said panel, connector jacks carried in predetermined spaced relation within said body and adapted to receive the conductive prongs of said components, and integral conductive extension means for each of said jacks each having a bent portion springing radially from said body, said bent portions adapted to contact said conductors on the reverse side of said panel and provide through said extension means a continuous conductive path between said conductors and said jack and to lock said socket into said aperture.

2. A socket for connecting components having parallel conductive pins to a supporting printed circuit sheet having a mounting aperture to receive said socket and having conductors on a reverse side extending to the edge of the aperture, comprising in combination, a socket body of insulating material for seating in said aperture, means on said body for contacting the obverse surface of said sheet, a plurality of jacks of conductive material within said body adapted to receive the connecting pins on said component, and integral conducting extension means for each of said jacks having a bent portion springing radially from said body, said bent portions adapted to contact said conductors and provide a continuous conductive path through said extension means between said conductors and said jacks and to lock said socket into said aperture.

3. A socket for connecting components having parallel conductive prongs to a metalized circuit panel having a socket mounting aperture therein and conductors on one surface extending to the edge of said aperture, comprising in combination, a plurality of jacks of conductive material in spaced parallel relation within said socket, means on said socket for contacting the unmetalized side of said panel, and integral conducting extension means for each of said jacks each having a bent portion springing radially from said body, said bent portions being adapted to contact said conductor and provide a continuous conductive path between said conductors and said jacks and to lock said socket into said aperture.

References Cited in the file of this patent

UNITED STATES PATENTS

| | | |
|---|---|---|
| 591,490 | Palm | Oct. 12, 1897 |
| 2,246,722 | Del Camp | June 24, 1941 |
| 2,376,625 | Schmitt | May 22, 1945 |
| 2,509,406 | Adams | May 30, 1950 |
| 2,524,939 | Stephan et al. | Oct. 10, 1950 |
| 2,569,550 | Barton | Oct. 2, 1951 |
| 2,595,188 | Del Camp | Apr. 29, 1952 |
| 2,613,244 | Del Camp | Oct. 7, 1952 |
| 2,631,184 | Sampson | Mar. 10, 1953 |

FOREIGN PATENTS

| | | |
|---|---|---|
| 247,937 | Great Britain | Nov. 18, 1925 |